(12) United States Patent
David et al.

(10) Patent No.: US 8,168,998 B2
(45) Date of Patent: May 1, 2012

(54) LED WITH REMOTE PHOSPHOR LAYER AND REFLECTIVE SUBMOUNT

(75) Inventors: Aurelien J. David, Palo Alto, CA (US); Rafael I. Aldaz, Pleasanton, CA (US); Mark Butterworth, Santa Clara, CA (US); Serge J. Bierhuizen, Santa Rosa, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 394 days.

(21) Appl. No.: 12/481,021

(22) Filed: Jun. 9, 2009

(65) Prior Publication Data

US 2010/0308354 A1    Dec. 9, 2010

(51) Int. Cl.
*H01L 27/15* (2006.01)
(52) U.S. Cl. ............ 257/100; 257/95; 257/98; 257/99; 257/E33.001; 438/26; 438/27; 313/502; 313/512
(58) Field of Classification Search .............. 257/95, 257/98–100; 313/502, 512; 362/800; 438/26–27, 438/29
See application file for complete search history.

(56) References Cited

U.S. PATENT DOCUMENTS

| | | | |
|---|---|---|---|
| 6,155,699 A | | 12/2000 | Miller |
| 6,717,362 B1 * | | 4/2004 | Lee et al. ................. 313/512 |
| 7,344,902 B2 | | 3/2008 | Basin et al. |
| 7,868,343 B2 * | | 1/2011 | Negley et al. ................. 257/99 |
| 2004/0159849 A1 | | 8/2004 | Negley |
| 2008/0054280 A1 | | 3/2008 | Reginelli |
| 2008/0144322 A1 * | | 6/2008 | Norfidathul et al. .......... 362/310 |
| 2009/0001399 A1 | | 1/2009 | Diana |
| 2009/0057708 A1 * | | 3/2009 | Abdul Karim et al. ....... 257/100 |
| 2010/0060157 A1 * | | 3/2010 | Shi .................................. 313/512 |

FOREIGN PATENT DOCUMENTS

EP    1840977 A1    10/2007

OTHER PUBLICATIONS

"ELiXIR-Solid State Luminaire with Enhanced Light Extraction by International Reflection" Allen et al, Journal of Display Technology vol. 3, No. 2, Jun. 2007.
By Steven C. Allen and Andrew J. Stecki, Entitled: A Nearly Ideal Phosphor-Converted White Light-Emitting Diode, Nanoelectronics Laboratory, University of Cincinnati, Ohio 45221, USA, Received Jan. 2, 2008; accepted Feb. 25, 2008; published online Apr. 10, 2008, Applied Physics Letters 92, 143309 (2008), pp. 1-3.

* cited by examiner

*Primary Examiner* — Kenneth Parker
*Assistant Examiner* — Jose R Diaz

(57) ABSTRACT

A light emitting device comprises a flip-chip light emitting diode (LED) die mounted on a submount. The top surface of the submount has a reflective layer. Over the LED die is molded a hemispherical first transparent layer. A low index of refraction layer is then provided over the first transparent layer to provide TIR of phosphor light. A hemispherical phosphor layer is then provided over the low index layer. A lens is then molded over the phosphor layer. The reflection achieved by the reflective submount layer, combined with the TIR at the interface of the high index phosphor layer and the underlying low index layer, greatly improves the efficiency of the lamp. Other material may be used. The low index layer may be an air gap or a molded layer. Instead of a low index layer, a distributed Bragg reflector may be sputtered over the first transparent layer.

9 Claims, 4 Drawing Sheets

LED WITH REMOTE PHOSPHOR LAYER AND REFLECTIVE SUBMOUNT

FIELD OF THE INVENTION

This invention relates to light emitting diodes (LEDs) with an overlying layer of phosphor to wavelength convert the LED emission and, in particular, to a technique of improving efficiency of an LED lamp with a remote phosphor.

BACKGROUND

To produce white light using a blue LED die, it is well known to deposit a YAG phosphor, or red and green phosphors, directly over the led die by, for example, spraying or spin-coating the phosphor in a binder, electrophoresis, applying the phosphor in a reflective cup, or other means. It is also known to affix a preformed tile of phosphor (e.g., a sintered phosphor powder) on the top of the LED die. Such phosphor layers are non-remote since they directly contact the surface of the semiconductor die. Blue light leaking through the phosphor, combined with the phosphor light, produces white light. Problems with such non-remote phosphors include: 1) there is significant backscattering of blue light from the phosphor layer, which is then partially absorbed by the LED, submount, and metal electrodes; 2) there is a significant amount of light generated by the phosphor that is partially absorbed by the LED, submount, and metal electrodes; 3) the photon density is very high for high power LEDs and saturates the phosphor; 4) the LED is very hot and phosphors may react to the heat to cause darkening of the polymer binder layer (e.g., silicone) in which the phosphor particles are imbedded; and 5) due to the various angles of blue light rays passing through different thicknesses of phosphors (a normal blue light ray passing through the least thickness), the color varies with viewing angle.

It is also known to infuse phosphor powder in a silicone binder and mold the silicone over the LED die to form a lens, such as described in U.S. Pat. No. 7,344,902, by Grigoriy Basin et al., assigned to the present assignee and incorporated herein by reference. The phosphor is distributed at a very low density in the lens. Such a remote phosphor creates a relatively large light source, whose brightness per unit area is greatly reduced compared to a LED die with a thin coating of phosphor. Also, since the phosphor overlies a large area of the submount, the phosphor light is partially absorbed by the submount, as well as the LED die and electrodes, so the efficiency of the white light LED is reduced.

The paper entitled, "A Nearly Ideal Phosphor-Converted White Light-Emitting Diode," by Allen et al., Applied Physics Letters 92, 143309 (2008), describes a bare LED die surrounded by an air gap and a hemispherical phosphor layer encapsulated by a transparent layer. There is poor light extraction from the LED into the air gap, and light is absorbed by the submount. It is also very difficult to economically manufacture the device.

What is needed is a technique to create a phosphor-converted LED, using a remote phosphor, that is very efficient by having less light absorbed by the LED and submount. It is also desirable to provide a remote phosphor where the resulting light source is smaller than a light source having phosphor infused in a silicone lens.

SUMMARY

In one embodiment, a blue LED die is mounted on a submount. The submount is provided with a reflective surface surrounding the die. The LED die has molded over it a thin hemispherical encapsulant, such a silicone or another high index of refraction transparent material. A thin reflective layer is then created over the encapsulant layer that allows blue light to pass through but reflects phosphor light from above. The reflective layer may a low index of refraction (low n) layer that totally reflects light at greater than the critical angle (e.g., an air gap or porous layer), or the reflective layer may be a distributed Bragg reflector. A phosphor layer is then deposited or molded over the reflective layer. The phosphor layer may be dense and thin so as not to create a large light source. A clear outer layer, such as a molded silicone lens, is then formed over the phosphor layer to protect the phosphor layer and provide optical properties such as creating a desired emission pattern and increasing light extraction.

Various techniques are described for forming the various layers over the LED die, with one method being a molding technique for forming all layers.

The inner hemispherical encapsulant, having an index between that of the LED die and the reflective layer, improves light extraction from the LED die. Since the phosphor "shell" is remote from the die, there is little backscattering of the blue light. Further, the phosphor light is reflected outward by the reflective layer and the reflective submount surface, improving efficiency. Further, any backscatter of blue light from the phosphor is reflected out by the reflective layer rather than going back into the LED since most of the backscattered light will not be normal to the reflective layer. Still further, since the remote phosphor is not infused in a lens, the phosphor shell may have a small diameter to create a bright light source. All the advantages of a remote phosphor are achieved while still creating a small light source.

The phosphor may be YAG, red, green, or any other color or combination of phosphors.

In one embodiment, the creation of the various layers is simultaneously performed on a wafer scale with hundreds of LED dies mounted on a submount wafer.

BRIEF DESCRIPTION OF THE DRAWINGS

Elements that are the same or equivalent are labeled with the same numeral.

DETAILED DESCRIPTION

Figure 1:
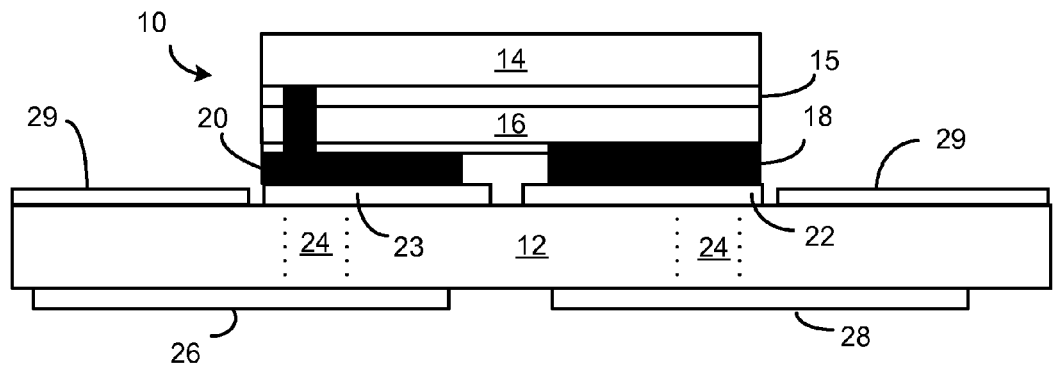
FIG. 1 is a cross-sectional view of a blue or UV flip-chip LED die, mounted on a submount, where the submount has a reflective top layer.

FIG. 1 illustrates a conventional flip chip LED die 10 mounted on a portion of a submount wafer 12. In a flip-chip, both the n and p contacts are formed on the same side of the LED die.

The LED die 10 is formed of semiconductor epitaxial layers, including an n-layer 14, an active layer 15, and a p-layer 16, grown on a growth substrate, such as a sapphire substrate. The growth substrate has been removed in FIG. 1 by laser lift-off, etching, grinding, or by other techniques. In one example, the epitaxial layers are GaN based, and the active layer 15 emits blue light. LED dies that emit UV light are also applicable to the present invention.

A metal electrode 18 electrically contacts the p-layer 16, and a metal electrode 20 electrically contacts the n-layer 14. In one example, the electrodes 18 and 20 are gold pads that are ultrasonically welded to anode and cathode metal pads 22 and 23 on a ceramic submount wafer 12. The submount wafer 12 has conductive vias 24 leading to bottom metal pads 26 and 28 for bonding to a printed circuit board. Many LEDs are mounted on the submount wafer 12 and will be later singulated to form individual LEDs/submounts.

Further details of LEDs can be found in the assignee's U.S. Pat. Nos. 6,649,440 and 6,274,399, and U.S. Patent Publications US 2006/0281203 A1 and 2005/0269582 A1, all incorporated herein by reference.

In accordance with one embodiment of the invention, a reflective layer 29 (e.g., R>90%) is formed over the surface of the submount wafer 12 to reflect light generated by a remote phosphor layer. Submounts are typically ceramic, silicon, or other light absorbing material. The reflective layer 29 may be a sputtered metal mirror (e.g., Al or Ag), a dielectric mirror, a metal/dielectric combination, or a non-absorbing diffuser. The reflective layer 29, in one embodiment, extends to all regions of the wafer 12 except over the LED die 10. In another embodiment, the reflective layer 29 is a specular ring around each LED die that extends at least under where the phosphor layer contacts the submount. When depositing the reflective layer 26, a mask (not shown) may be temporarily formed over the LED die areas, prior to attachment of the LED dies, to prevent the reflective layer 29 from covering the metal pads 22 and 23, or a printing process may be used to form the reflective layer 29. The reflective layer 29 will increase the efficiency of the lamp.

Figure 2:
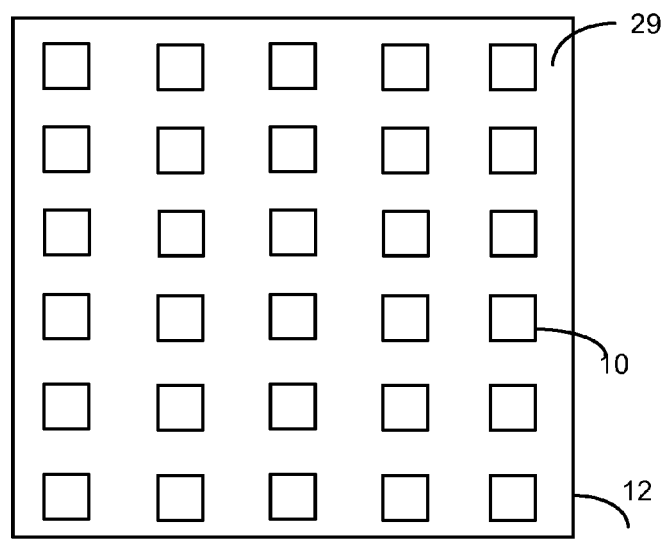
FIG. 2 illustrates a simplified submount wafer populated by an array of LED dies, such as 500-4000 LEDs, where all LED dies on the wafer are simultaneously processed.

FIG. 2 is a simplified illustration of a submount wafer 12 on which is mounted an array of LED dies 10. There may be 500-4000 LEDs on a single submount wafer 12. All LEDs on the wafer 12 will be processed simultaneously using the method described below.

A first silicone layer is molded over the LED dies 10 to encapsulate the dies 10 as follows.

Figure 3:
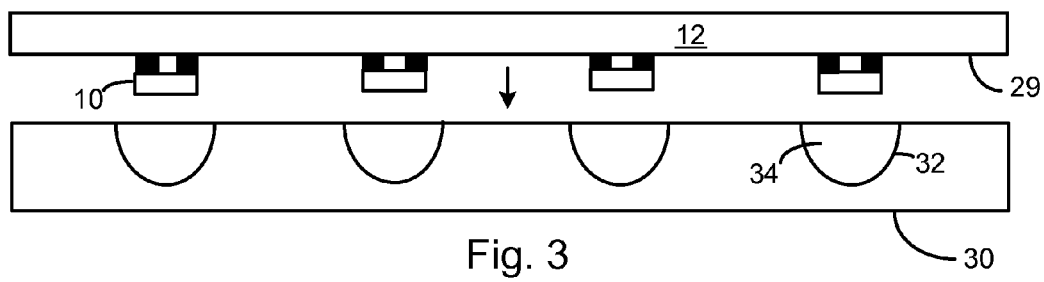
FIG. 3 illustrates the submount wafer being brought against a mold for forming a first silicone layer for encapsulating the LED dies and spacing a phosphor layer from the LED dies. The same molding process, using different molds, may be used for forming all layers rather than the process of FIGS. 5-8.

FIG. 3 illustrates a portion of the submount wafer 12 and LED dies 10 being positioned over a mold 30 having cavities 32 filled with liquid silicone 34, or softened silicone 34, or powered silicone 34, or silicone in tablets. If the silicone 34 is not dispensed in liquid or softened form, the mold 30 is heated to soften the silicone 34. The submount wafer 12 is brought against the mold 30 so that the LED dies 10 are immersed in the silicone 34 in each cavity 32. The wafer 12 and mold 30 are pressed together to force the silicone 34 to fill all voids. A perimeter seal allows the pressure to be high while allowing all air to escape as the silicone 34 fills the voids. A vacuum may also be pulled between the wafer 12 and the mold 30 using a vacuum source around the seal.

The mold 30 is then heated to cure the silicone 34, depending on the type of silicone 34 used. If the original silicone 34 was a solid (e.g., a powder or tablets) at room temperature, the mold 30 is cooled to harden the silicone 34. Alternatively, a transparent mold may be used and the silicone 34 may be cured with UV light.

Figure 4:
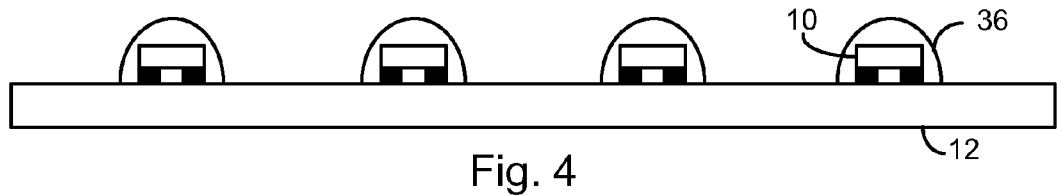
FIG. 4 illustrates the LED dies after encapsulation.

The mold 30 is then removed from the wafer 12, resulting in the structure of FIG. 4, where the resulting silicone layer 36 encapsulates each LED die 10. In the embodiment shown, the silicone layer 36 is formed to have a substantially hemispherical shape. The thickness of the silicone layer 36 is not critical since the LED light expands in a Lambertian pattern through the transparent silicone layer 36.

The wafer 12 may then be subjected to a post-cure temperature of about 250° C. to additionally harden the silicone layer 36, depending on the type of silicone 34 used. Materials other than silicone may be used such as an epoxy molding compound in powder form or another suitable polymer.

The silicone layer 36 may also be formed using injection molding, where the wafer 12 and mold are brought together, a liquid silicone is pressure-injected into the mold through inlets, and a vacuum is created. Small channels between the mold cavities allow the silicone to fill all the cavities. The silicone is then cured by heating, and the mold is separated from the wafer 12.

The silicone layer 36 (a polymer) may instead be formed of a high index glass, epoxy, or other material.

One technique for forming additional layers over the LED die 10 and silicone layer 36 is described with respect to FIGS. 5-8. An all-molding process is described later.

Figure 5:
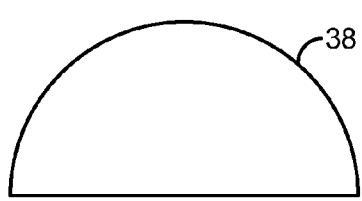
FIG. 5 illustrates a solid hemispherical outer lens.

In FIG. 5, a solid hemispherical dome 38 is formed by molding or another technique. The dome 38 may have a diameter on the order of 5 mm. The dome may be silicone, epoxy, sapphire, or other suitable transparent material.

Figure 6:
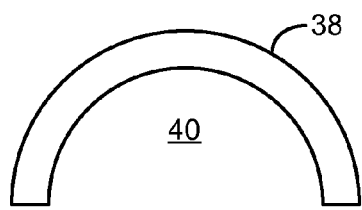
FIG. 6 illustrates the lens of FIG. 5 that is machined to create a cavity.

In FIG. 6, the dome 38 is machined or processed to form a cavity 40, having a diameter on the order of 3 mm. In one embodiment, the molding process for dome 38 may create a thin connector between domes in an array of domes that match the locations of the LED dies 10 on the submount wafer 12 to simplify handling.

Figure 7:
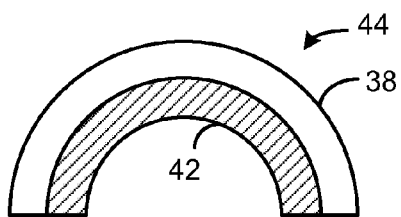
FIG. 7 illustrates the cavity of FIG. 6 having a phosphor layer deposited over it.

In FIG. 7, a thin phosphor layer 42, on the order of a few hundred microns, is formed in the cavity to a substantially uniform thickness. This may be done using a lamination of a preformed flexible sheet of phosphor infused in a silicone binder. The phosphor may also be deposited by spraying phosphor in a silicone binder, electrophoresis, deposition followed by machining, or by other techniques. As in all embodiments, the phosphor layer 42 may comprise a plurality of different phosphor layers or a mixture of phosphors, such as YAG, red, and/or green phosphors to produce white light. If a UV LED were used, a blue phosphor would also be used to create white light.

Figure 8:
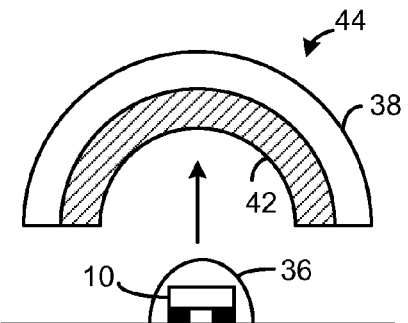
FIG. 8 illustrates the lens and phosphor layer being affixed over the encapsulated die.

The completed cap 44 is then aligned with each LED die 10, as shown in FIG. 8, and the cap 44 is affixed to the surface of the submount wafer 12 surrounding each LED die 10. Silicone may be used as an adhesive.

Figure 9:
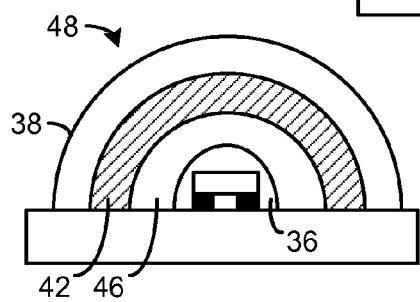
FIG. 9 illustrates the lens and phosphor layer affixed over the encapsulated die, with an air gap between the phosphor layer and the encapsulant to provide TIR.

As shown in FIG. 9, there is an air gap 46 between the phosphor layer 42 and the silicone layer 36. The LED die 10 has sides about 1 mm, the silicone layer 36 has a diameter of about 2 mm, the phosphor layer 42 is a few hundreds of microns, and the cavity 40 has a diameter of about 3 mm, leaving an air gap 46 of about 0.2-0.5 mm around the silicone layer 36. Since the index of refraction (n) of the air gap 46 is about 1, and the n of the phosphor layer 42 is on the order of 1.7-2, any phosphor light generated towards the air gap 46 at greater than the critical angle will be totally reflected back and not be absorbed by the LED die 10, electrodes, or other elements.

By making the silicone layer 36 substantially hemispherical around the LED die 10, there will be very little TIR of the LED light at the interface of the air gap 46 and the silicone layer 46. The silicone layer 36 improves the extraction of light from the LED die 10 since its index of refraction (e.g., >1.5) is closer to the index of refraction of the LED die 10 (e.g., >2.2).

Figure 10:
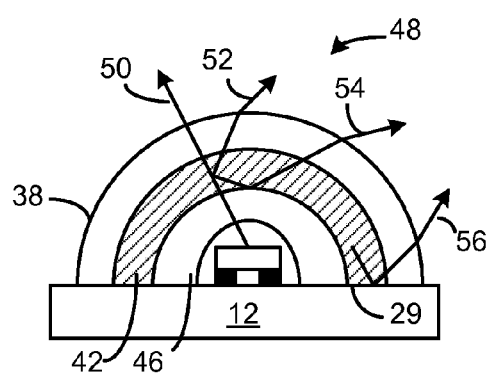
FIG. 10 illustrates various light rays in the light source of FIG. 9 showing the reflection by the air gap and the submount surface.

FIG. 10 shows how various light rays generated will be reflected in the lamp 48 of FIG. 9. Ray 50 is a blue ray from the LED die 10, and leaks through the phosphor layer 42. Ray 52 is an emission (e.g., yellow, red, green, etc.) from a phosphor particle that is in a direction away from the air gap 46. Ray 54 is an emission from the phosphor particle that reflects off the air gap 46 interface at greater than the critical angle and exits the lamp 48 without impinging on the LED 10 or submount wafer 12. Ray 56 is an emission from a phosphor particle that reflects off the reflective layer 29 (FIG. 1) on the submount wafer 12.

Also, ray 54 may be a backscattered blue ray from the LED die. Although the blue ray generally enters the phosphor layer near normal incidence, the backscatter from the phosphor is generally isotropic, so the backscattered light is at a wide range of angles. Any backscattered blue light greater than the critical angle is reflected out by the air gap 46 interface (or other reflective layer described herein) rather than going back into the LED.

The combination of the low index layer (air gap 46), silicone layer 36, and reflective layer 29 greatly increase the light extraction from the lamp 48.

Figure 11:
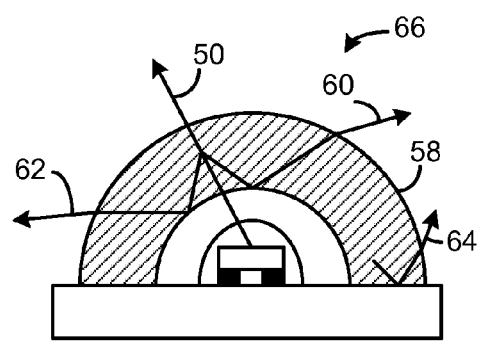
FIG. 11 illustrates a light source with phosphor infused in the outer lens showing the reflection by the air gap and the submount surface.

FIG. 11 illustrates that, instead of forming the cap of FIG. 7, a thicker cap of a low density of phosphor particles in a silicone lens 58 may be used. The air gap 46 serves as a reflector as in FIG. 10. Ray 50 is a blue ray from the LED die 10 leaking through the lens 58. Rays 60 and 62 are rays from a phosphor particle (or backscattered blue light) that have reflected off the air gap 46 interface. Ray 64 is a ray from a phosphor particle that reflected off the reflective layer 29 (FIG. 1) on the submount wafer 12. Since the silicone lens 58 is much wider than the phosphor layer 42 in FIG. 10, the brightness of the lamp 66 per unit area will be less than that of FIG. 10, which may be advantageous or disadvantageous depending on the application.

The technique of FIGS. 5-11 may be difficult due to the handling and various alignments.

Figure 12:
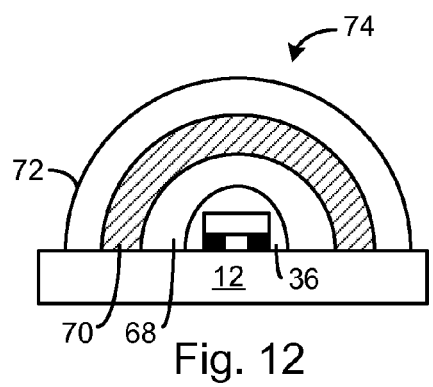
FIG. 12 illustrates a light source where each layer is formed by a successive molding process over the LED die, and the low index of refraction (n) layer may be any moldable layer including a sacrificial sol-gel layer.

Successive molding processes, represented by FIG. 3, may be used to form the structure shown in FIG. 12, where, instead of an air gap, a low index material is molded directly over the silicone layer 36. In one embodiment, the silicone layer 36 is molded as previously described. Next, a mold having larger cavities 32 (FIG. 3) is filled with sol-gel. Sol-gel is well known and comprises nano-particles in a solvent to form a gel. Such a substance can be molded. The solvent is then dried by heat, resulting in some shrinkage and crystals formed by the nano-particles. The resulting layer will be extremely porous and effectively acts like an air gap. The index of refraction is very low since the structure is mostly space. The sol-gel layer is shown as layer 68 in FIG. 12. Instead of sol-gel, another low index material can be used, as long as the index is lower than the phosphor layer.

Next, another mold with slightly larger dome shaped cavities is filled with phosphor particles infused in silicone. The submount wafer 12 with molded sol-gel domes is then brought against the mold as discussed with respect to FIG. 3. The phosphor layer 70 is then cured by heat. A final silicone lens 72 is then molded over the phosphor layer, or the phosphor layer may be the final layer. The operation of the resulting lamp 74 is similar to that shown in FIG. 10 or FIG. 11, depending if the phosphor layer were the final layer.

Figure 13:
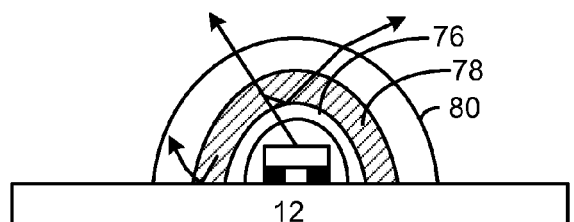
FIG. 13 illustrates a light source where the reflective layer is a distributed Bragg reflector (DBR).

FIG. 13 illustrates that the low index layer (46 or 68) can instead be a deposited Bragg reflector (DBR) 76. A DBR 76 can be made very thin using conformal sputtering and may consists of 10 pairs of $SiO_2/Ta_2O_5$ (indicies n=1.5 and 2, respectively) with thicknesses 98 nm and 64 nm (provides reflectively at 450 nm (blue) around 40 degrees), followed by 6 pairs of $SiO_2/Ta_2O_5$ with thicknesses 129 nm and 81 nm (provides reflectivity at 550 nm (green) around 45 degrees). The DBR 76 is substantially transparent at 450 nm around normal incidence of the LED light (R<10%) until an angle of 15 degrees. The DBR 76 is reflective at greater than 15 degrees. The phosphor layer 78 and outer silicone lens 80 are then molded as previously described. FIG. 13 illustrates various light rays passing through the DBR 76, and being reflected off the DBR 76, and being reflected off the submount surface.

For all these designs to be efficient, the extraction efficiency from the inner silicone dome must be high. This requires that LED light impinge at this interface with an angle less than the critical angle and, therefore, the radius of the inner dome must be large enough. Therefore, in general, a trade-off exists between the requirement of small incidence angles and small source size. If the die is 1×1 mm and the radius of the inner dome is 2 mm, a large fraction of the light impinges on the dome at small angles (less than 15 degrees), and only a few rays impinge at angles as high as 20 degrees. This is smaller than the angle of total internal refraction for an epoxy (or silicone)/air interface (about 41 degrees) and smaller than the maximum angle of high transmission for the DBR. Therefore, such dimensions are suitable for the implementations described in this application.

Figure 14:
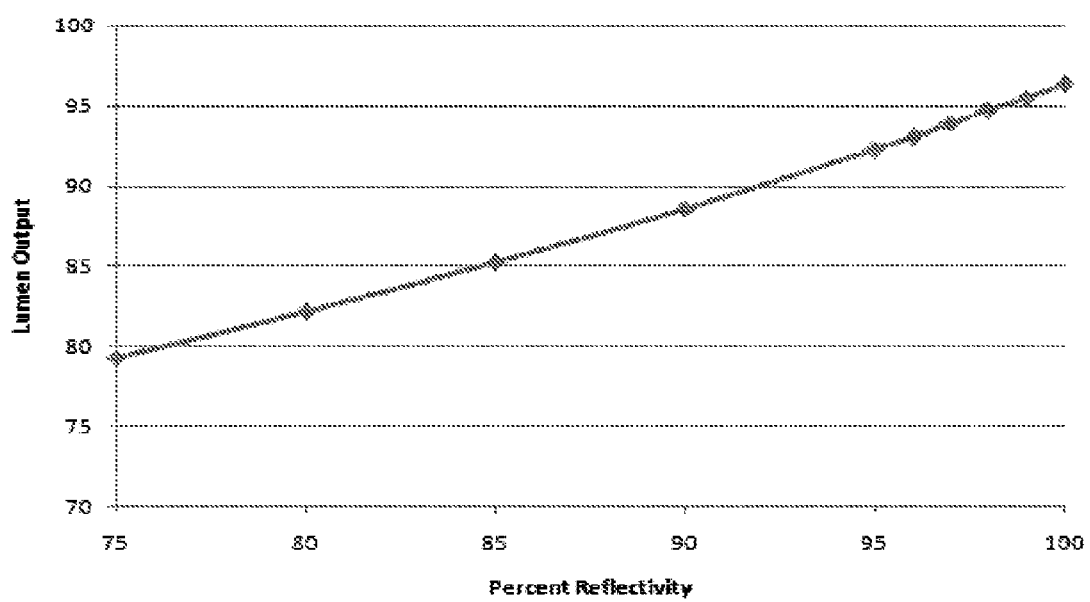
FIG. 14 is a graph illustrating the improvement in lumen output vs. reflectivity of the reflective layer on the submount.

FIG. 14 is a graph illustrating the approximate improvement in lumen output vs. reflectivity of the reflective layer 29 (FIG. 1) on the submount when used with the remote phosphor embodiments of the present invention.

Various combinations of all the embodiments may be used to create a remote phosphor lamp with high efficiency.

In addition to the improved efficiency, the remote hemispherical phosphor layer, having a substantially uniform thickness, enables uniform color vs. viewing angle, and the phosphor is not degraded by heat.

The submount wafer 12 is then singulated to form individual LEDs/submounts, where the various figures can represent the individual LEDs/submounts.

In this disclosure, the term "submount" is intended to mean a support for at least one LED die, where electrical contacts on the submount are bonded to electrodes on the LED dies, and where the submount has electrodes that are to be connected to a power supply.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   a flip-chip light emitting diode (LED) die on a submount;
   a reflective layer, having a reflectivity of at least 90% for visible wavelengths, formed on a top surface of the submount;
   a transparent substantially hemispherical first layer encapsulating the LED die, the first layer having a first index of refraction;
   a substantially hemispherical second layer surrounding the first layer the second layer comprising a sol-gel that has been dried to form a porous layer so as to have a second index of refraction lower than the first index of refraction; and
   a substantially hemispherical phosphor layer formed over the second layer, the second layer having characteristics that cause the second layer to reflect light from the phosphor layer at least when the light is greater than a certain angle with respect to the second layer,
   wherein the reflective layer on the top surface of the submount extends at least below a portion of the phosphor layer.

2. The device of claim 1 wherein the phosphor layer has a third index of refraction greater than the first index of refraction.

3. The device of claim 1 wherein the phosphor layer comprises phosphor powder infused in silicone.

4. The device of claim 1 further comprising a transparent third layer surrounding the phosphor layer.

5. The device of claim 1 wherein the LED die emits blue light and the phosphor layer has a characteristic that converts a portion of the blue light to light that, when combined with the blue light, creates white light.

6. A method for forming a light emitting device comprising:
   providing a flip-chip light emitting diode (LED) die on a submount;
   forming a reflective layer, having a reflectivity of at least 90% for visible wavelengths, on a top surface of the submount;
   molding a transparent substantially hemispherical first layer over and encapsulating the LED die, the first layer having a first index of refraction;
   forming a substantially hemispherical second layer surrounding the first layer, the second layer comprising a sol-gel that has been dried to form a porous layer so as to have a second index of refraction lower than the first index of refraction; and
   molding a substantially hemispherical phosphor layer over the second layer, the second layer having characteristics that cause the second layer to reflect light from the phosphor layer at least when the light is greater than a certain angle with respect to the second layer,
   wherein the reflective layer on the top surface of the submount extends at least below a portion of the phosphor layer.

7. The method of claim 6 wherein forming the substantially hemispherical second layer surrounding the first layer comprises molding the sol-gel over the first layer and drying the sol-gel to create the second layer having the second index of refraction less than the index of refraction of the phosphor layer.

8. The method of claim 1 wherein molding a substantially hemispherical phosphor layer comprises molding a layer having phosphor powder infused in silicone.

9. The method of claim 1 further comprising molding a transparent third layer over the phosphor layer.

* * * * *